US012775212B2

(12) United States Patent
Kim et al.

(10) Patent No.: US 12,775,212 B2
(45) Date of Patent: *Oct. 27, 2026

(54) HARDMASK COMPOSITION, HARDMASK LAYER, AND METHOD OF FORMING PATTERNS

(71) Applicant: SAMSUNG SDI CO., LTD., Yongin-si (KR)

(72) Inventors: Yoona Kim, Suwon-si (KR); Hyejeong Kim, Suwon-si (KR); Sunyoung Yang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1021 days.

This patent is subject to a terminal disclaimer.

(21) Appl. No.: 17/902,167

(22) Filed: Sep. 2, 2022

(65) Prior Publication Data

US 2023/0120368 A1 Apr. 20, 2023

(30) Foreign Application Priority Data

Sep. 7, 2021 (KR) ........................ 10-2021-0119383

(51) Int. Cl.
*G03F 7/11* (2006.01)
*G03F 7/09* (2006.01)
(Continued)

(52) U.S. Cl.
CPC ................ *G03F 7/11* (2013.01); *G03F 7/092* (2013.01); *G03F 7/202* (2013.01); *G03F 7/36* (2013.01); *G03F 7/40* (2013.01)

(58) Field of Classification Search
CPC ............... G03F 7/11; G03F 7/092; G03F 7/36
See application file for complete search history.

(56) References Cited

U.S. PATENT DOCUMENTS

2008/0160461 A1 7/2008 Yoon et al.
2011/0097672 A1 4/2011 Yoon et al.
(Continued)

FOREIGN PATENT DOCUMENTS

CN 101370849 A 2/2009
CN 102566282 A 7/2012
(Continued)

OTHER PUBLICATIONS

Office Action (including a search report) dated Jun. 17, 2023, of the corresponding Taiwanese Patent Agglication No. 111133581.
(Continued)

*Primary Examiner* — John S. Chu
(74) *Attorney, Agent, or Firm* — Lee IP Law, P.C.

(57) ABSTRACT

A hardmask composition, a hardmask layer manufactured from the hardmask composition, and a method of forming patterns from the hardmask composition, the composition includes a polymer including a structural unit represented by Chemical Formula 1 and a structural unit represented by Chemical Formula 2, and a solvent,

[Chemical Formula 1]

(Continued)

-continued

[Chemical Formula 2]

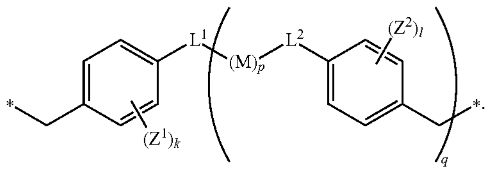

17 Claims, 1 Drawing Sheet

(51) Int. Cl.

| | |
|---|---|
| ***G03F 7/20*** | (2006.01) |
| ***G03F 7/36*** | (2006.01) |
| ***G03F 7/40*** | (2006.01) |

(56) References Cited

U.S. PATENT DOCUMENTS

| | | | |
|---|---|---|---|
| 2012/0153424 A1 | 6/2012 | Oh et al. | |
| 2012/0252218 A1 | 10/2012 | Kori et al. | |
| 2013/0189533 A1* | 7/2013 | Okuyama | G03F 7/091 428/524 |
| 2015/0332931 A1 | 11/2015 | Nam et al. | |
| 2016/0090449 A1 | 3/2016 | Nam et al. | |
| 2016/0363864 A1 | 12/2016 | Park et al. | |
| 2017/0110328 A1 | 4/2017 | Kwon et al. | |
| 2017/0114181 A1 | 4/2017 | Park et al. | |
| 2017/0176861 A1 | 6/2017 | Nam et al. | |
| 2017/0199457 A1* | 7/2017 | Hatakeyama | G03F 7/0752 |
| 2019/0016906 A1 | 1/2019 | Seol et al. | |
| 2020/0381247 A1 | 12/2020 | Kori et al. | |
| 2021/0003920 A1 | 1/2021 | Kori et al. | |
| 2023/0101786 A1* | 3/2023 | Kim | G03F 7/202 430/271.1 |

FOREIGN PATENT DOCUMENTS

| | | | |
|---|---|---|---|
| CN | 105093834 | A | 11/2015 |
| CN | 106188504 | A | 12/2016 |
| CN | 106905511 | A | 6/2017 |
| CN | 109212902 | A | 1/2018 |
| CN | 108291013 | A | 7/2018 |
| CN | 109143781 | A | 1/2019 |
| CN | 109188866 | A | 1/2019 |
| CN | 109254499 | A | 1/2019 |
| CN | 111290216 | A | 6/2020 |
| CN | 111542558 | A | 8/2020 |
| CN | 110383173 | A | 5/2023 |
| EP | 3428722 | A1 | 1/2019 |
| JP | 2016-197228 | A | 11/2016 |
| JP | 2017-078165 | A | 4/2017 |
| JP | 2017-110223 | A | 6/2017 |
| JP | 2020-193325 | A | 12/2020 |
| KR | 10-2016-0020862 | A | 2/2016 |
| KR | 10-1681796 | B1 | 12/2016 |
| KR | 10-2017-0045592 | A | 4/2017 |
| KR | 10-2017-0072035 | A | 6/2017 |
| KR | 10-2017-0078503 | A | 7/2017 |
| KR | 10-1932832 | B1 | 12/2018 |
| KR | 10-2019-0001377 | A | 1/2019 |
| KR | 10-2019-0002987 | A | 1/2019 |
| KR | 10-2019-0078303 | A | 7/2019 |
| KR | 10-2020-0121758 | A | 10/2020 |
| KR | 10-2020-0134063 | A | 12/2020 |
| KR | 10-2021-0004875 | A | 1/2021 |
| TW | 201643204 | A | 12/2016 |
| TW | 201816517 | A | 5/2018 |
| TW | 2020/37690 | A | 10/2020 |
| WO | WO 2008-082241 | A1 | 7/2008 |
| WO | WO 2017-115978 | A1 | 7/2017 |
| WO | WO 2017-126779 | A1 | 7/2017 |

OTHER PUBLICATIONS

Korean Notice of Allowance dated Dec. 9, 2024, of the corresponding Korean Patent Application No. 10-2021-0119383.

Chinese Office action dated Jan. 30, 2026.

* cited by examiner

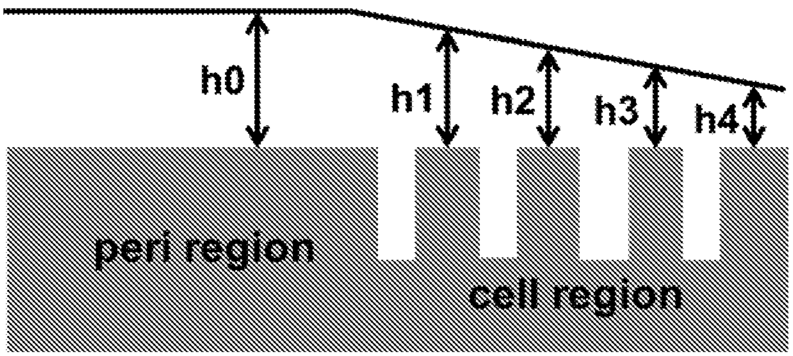
h0
h1
h2
h3
h4
peri region
cell region

HARDMASK COMPOSITION, HARDMASK LAYER, AND METHOD OF FORMING PATTERNS

CROSS-REFERENCE TO RELATED APPLICATION

This application claims priority to and the benefit of Korean Patent Application No. 10-2021-0119383 filed in the Korean Intellectual Property Office on Sep. 7, 2021, the entire contents of which are incorporated herein by reference.

BACKGROUND

1. Field

Embodiments relate to a hardmask composition, a hardmask layer including a cured product of the hardmask composition, and a method of forming patterns using the hardmask composition.

2. Description of the Related Art

Recently, the semiconductor industry has developed to an ultra-fine technique having a pattern of several to several tens of nanometers in size. Such ultrafine technique use effective lithographic techniques.

Some lithographic techniques may include providing a material layer on a semiconductor substrate; coating a photoresist layer thereon; exposing and developing the same to provide a photoresist pattern; and etching a material layer using the photoresist pattern as a mask.

SUMMARY

The embodiments may be realized by providing a hardmask composition including a polymer including a structural unit represented by Chemical Formula 1 and a structural unit represented by Chemical Formula 2, and a solvent,

[Chemical Formula 1]

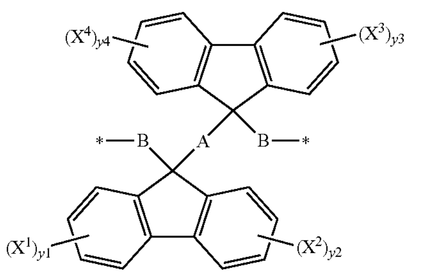

wherein, in Chemical Formula 1, A is a linking group containing a hetero ring, B is a C6 to C30 aromatic hydrocarbon ring substituted with one or more hydroxy groups or C1 to C10 alkoxy groups, and * is a linking point, $X^1$ to $X^4$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, y1 to y4 are each independently an integer of 0 to 4, and * is a linking point.

[Chemical Formula 2]

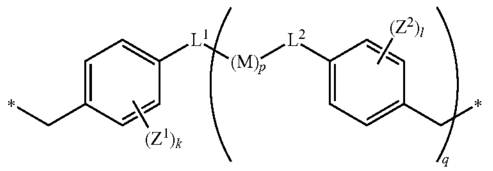

wherein, in Chemical Formula 2, $L^1$ and $L^2$ are each independently a single bond, a substituted or unsubstituted divalent C1 to C15 saturated aliphatic hydrocarbon group, or a substituted or unsubstituted divalent C2 to C15 unsaturated aliphatic hydrocarbon group, M is —O—, —S—, —$SO_2$—, or —C(═O)—, $Z^1$ and $Z^2$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, k, l, and q are each independently an integer of 0 to 4, p is 0 or 1, and * is a linking point.

The embodiments may be realized by providing a hardmask layer comprising a cured product of the hardmask composition according to an embodiment.

The embodiments may be realized by providing a method of forming patterns, the method including providing a material layer on a substrate, applying the hardmask composition according to an embodiment on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed part of the material layer.

BRIEF DESCRIPTION OF THE DRAWING

Features will be apparent to those of skill in the art by describing in detail exemplary embodiments with reference to the attached drawing in which:

the FIGURE is a reference view schematically illustrating a cross-section of a hardmask layer in order to explain a method for evaluating gap-fill characteristics and planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or A and B.

As used herein, when a definition is not otherwise provided, 'substituted' may refer to replacement of a hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

In addition, adjacent two substituents of the substituted halogen atom (F, Br, Cl, or I), the hydroxy group, the nitro group, the cyano group, the amino group, the azido group, the amidino group, the hydrazino group, the hydrazono group, the carbonyl group, the carbamyl group, the thiol group, the ester group, the carboxyl group or the salt thereof, the sulfonic acid group or the salt thereof, the phosphoric acid or the salt thereof, the C1 to C30 alkyl group, the C2 to C30 alkenyl group, the C2 to C30 alkynyl group, the C6 to C30 aryl group, the C7 to C30 arylalkyl group, the C1 to C30 alkoxy group, the C1 to C20 heteroalkyl group, the C3 to C20 heteroarylalkyl group, the C3 to C30 cycloalkyl group, the C3 to C15 cycloalkenyl group, the C6 to C15 cycloalkynyl group, the C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" may refer to one including 1 to 3 heteroatoms selected from N, O, S, Se, and P.

As used herein, when a definition is not otherwise provided, "saturated aliphatic hydrocarbon group" includes a functional group in which all bonds between carbons are single bonds, for example, an alkyl group or an alkylene group.

As used herein, when a definition is not otherwise provided, "unsaturated aliphatic hydrocarbon group" refers to a functional group in which an intercarbon bond includes one or more unsaturated bonds, and may include, for example, a double bond or a triple bond, for example, an alkenyl group, an alkynyl group, an alkenylene group, or an alkynylene group.

As used herein, when a definition is not otherwise provided, "aromatic hydrocarbon group" refers to a group having one or more hydrocarbon aromatic moieties, in which hydrocarbon aromatic moieties are linked by a single bond and hydrocarbon aromatic moieties are directly or indirectly fused with non-aromatic fused rings. More specifically, the substituted or unsubstituted aromatic hydrocarbon group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a combination thereof, or a combined fused ring of the foregoing groups, but is not limited thereto.

As used herein, when specific definition is not otherwise provided, the term "combination" refers to mixing or copolymerization.

Also, as used herein, the polymer may include both an oligomer and a polymer.

Unless otherwise specified in the present specification, the "molecular weight" is measured by dissolving a powder sample in tetrahydrofuran (THF) and then using 1200 series Gel Permeation Chromatography (GPC) of Agilent Technologies (column is Shodex Company LF-804, standard sample is Shodex company polystyrene).

There is a constant trend in a semiconductor industry to reduce a size of chips, and in order to help meet this demand, a line width of a resist may be patterned to have several tens of nanometers through lithography. Accordingly, a height of the resist may be limited in order to maintain the line width of the resist pattern, and the resist may have insufficient resistance in the etching process. In order to compensate for this, an auxiliary layer, which is called a hardmask layer, may be used between a material layer to be etched and a photoresist layer. This hardmask layer may serve as an interlayer that transfers a fine pattern of the photoresist layer through selective etching and thus may have so sufficient etch resistance as to withstand the etching process during the pattern transfer.

Some hardmask layers may be formed in a chemical or physical deposition method, may have low economic efficiency due to a large-scale equipment and a high process cost, and a spin-coating technique for forming a hardmask layer has recently been developed. The spin-coating technique may be an easier process to conduct than other methods, and a hardmask layer formed therefrom may exhibit excellent gap-fill characteristics and planarization characteristics, but etch resistance for the hardmask layer could be somewhat deteriorated.

In order to improve the etch resistance of the hardmask layer, maximizing a carbon content of a hardmask composition has been considered. As the carbon content of the hardmask composition is maximized, solubility of the composition in a solvent may be deteriorated, and the spin-coating technique could be difficult to apply. Accordingly, the hardmask composition may be improved in terms of the etch resistance without lowering solubility in a solvent.

One or more embodiments may provide a hardmask composition for forming a hardmask that exhibits excellent gap-fill characteristics and planarization characteristics without deteriorating the etch resistance. Simultaneously, appropriate solubility of the hardmask composition in a solvent may be achieved.

As a result, the carbon content in the hardmask composition may be increased by using a polymer including an aromatic hydrocarbon ring to help improve etch resistance of a hardmask layer formed thereof. In an implementation, the polymer may include a quaternary carbon so that solubility in a solvent may not be decreased. In addition, the polymer included in the hardmask composition may also include a flowable linking group to help improve flowability of the composition during the coating process, and the hardmask layer formed thereof exhibits excellent gap-fill characteristics and planarization characteristics.

A hardmask composition according to an embodiment may include, e.g., a polymer including a structural unit represented by Chemical Formula 1 and a structural unit represented by Chemical Formula 2, and a solvent. In an implementation, the polymer may include the structural units as repeating units in the backbone of the polymer.

[Chemical Formula 1]

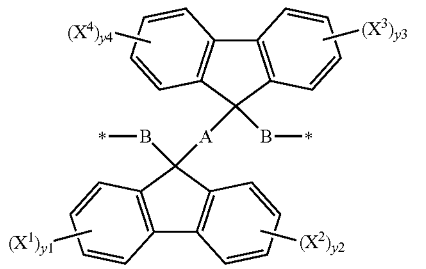

In Chemical Formula 1, A may be, e.g., a linking group containing a hetero ring.

Each B may independently be or include, e.g., a C6 to C30 aromatic hydrocarbon ring substituted with one or more hydroxy groups or C1 to C10 alkoxy groups, $X^1$ to $X^4$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, y1 to y4 are each independently an integer of 0 to 4, and

* is a linking point.

[Chemical Formula 2]

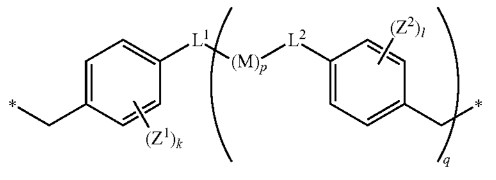

In Chemical Formula 2, $L^1$ and $L^2$ may each independently be or include, e.g., a single bond, a substituted or unsubstituted divalent C1 to C15 saturated aliphatic hydrocarbon group, or a substituted or unsubstituted divalent C2 to C15 unsaturated aliphatic hydrocarbon group.

M may be, e.g., —O—, —S—, $—SO_2—$, or —C(═O)—.

$Z^1$ and $Z^2$ may each independently be or include, e.g., deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group.

k, l, and q may each independently be, e.g., an integer of 0 to 4.

p may be, e.g., 0 or 1.

* is a linking point.

As described above, the polymer in the composition according to an embodiment may include aromatic hydrocarbon rings in both the structural unit represented by Chemical Formula 1 and the structural unit represented by Chemical Formula 2, thereby maximizing a carbon content in the composition. In addition, flexibility of the polymer may be increased by including the structural unit represented by Chemical Formula 2. The flexible structure may not only help increase a free volume of the polymer to help improve a solubility of the composition containing it, but may also help increase a reflow during the baking process by lowering a glass transition temperature (Tg), thereby it is possible to improve gap-fill characteristics and planarization characteristics of the hardmask layer formed from such a composition.

In addition, the polymer may include two fluorene moieties per one structural unit represented by Chemical Formula 1 to help increase the carbon content in the polymer, so that the hardmask layer formed from the hardmask composition including the polymer may have high etch resistance. At the same time, by including a quaternary carbon in Chemical Formula 1, and A in Chemical Formula 1 includes a heterocyclic ring, solubility of the polymer including the same in a solvent may be increased.

In an implementation, A of Chemical Formula 1 may have a structure in which the same or different rings are fused to each other on two non-parallel sides of the hetero ring. In an implementation, A in Chemical Formula 1 may be represented by, e.g., Chemical Formula 3.

[Chemical Formula 3]

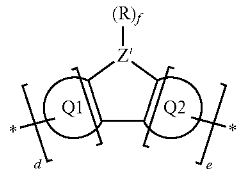

In Chemical Formula 3, Z' may be, e.g., N, O, or S.

Q1 and Q2 may each independently be, e.g., a substituted or unsubstituted C4 to C30 saturated or unsaturated alicyclic hydrocarbon group or a substituted or unsubstituted C6 to C30 aromatic hydrocarbon group. For example, the groups of Q1 and Q2 may each share two carbons with the Z'-containing ring of Chemical Formula 3, to which Q1 and Q2 are fused.

R may be, e.g., hydrogen, a substituted or unsubstituted monovalent C1 to C30 saturated aliphatic hydrocarbon group, a substituted or unsubstituted monovalent C2 to C30 unsaturated aliphatic hydrocarbon group, or a substituted or unsubstituted monovalent C6 to C30 aromatic hydrocarbon group.

d and e may each independently be, e.g., an integer of 0 to 5, f may be, e.g., an integer of 0 to 2, and * is a linking point.

When d or e in Chemical Formula 3 is not 0, the carbon content in the polymer including the same may be further increased, and etch resistance of the hard mask layer formed therefrom may be further increased.

In an implementation, A in Chemical Formula 1 may be represented by, e.g., Chemical Formula 3-1.

[Chemical Formula 3-1]

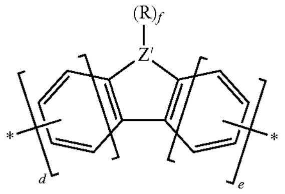

In Chemical Formula 3-1, Z' may be, e.g., N, O, or S.

R may be, e.g., hydrogen, a substituted or unsubstituted monovalent C1 to C30 saturated aliphatic hydrocarbon group, a substituted or unsubstituted monovalent C2 to C30 unsaturated aliphatic hydrocarbon group, or a substituted or unsubstituted monovalent C6 to C30 aromatic hydrocarbon group.

d and e may each independently be, e.g., an integer of 0 to 5, f may be, e.g., an integer of 0 to 2, and * is a linking point.

In an implementation, when R is a substituted or unsubstituted monovalent C1 to C30 saturated aliphatic hydrocarbon group, it may be, e.g., a C1 to C30 alkyl group, such as a methyl group, an ethyl group, a propyl group, a butyl group, a pentyl group, a hexyl group, a heptyl group, an octyl group, or the like, e.g., a methyl group, an ethyl group, a propyl group, or a butyl group, which may be substituted or unsubstituted.

In an implementation, when R is a substituted or unsubstituted monovalent C2 to C30 unsaturated aliphatic hydrocarbon group, e.g., it may be a C2 to C30 alkenyl group or a C2 to C30 alkynyl group, such as a vinyl group, a propenyl group, a butenyl group, a pentenyl group, a hexenyl group, a heptenyl group, an octenyl group, and the like, for example, a propenyl group, a butenyl group, or a pentenyl group. In addition, it may be an ethynyl group, a propynyl group, a butynyl group, a pentynyl group, a hexynyl group, a heptynyl group, an octynyl group, or the like, e.g., a propynyl group, a butynyl group, a pentynyl group, which may be substituted or unsubstituted.

In an implementation, when R is a substituted or unsubstituted monovalent C6 to C30 aromatic hydrocarbon group, it may be, e.g., a phenyl group, a naphthyl group, an anthracenyl group, a phenanthryl group, a naphthacenyl group, a pyrenyl group, or the like, which may be substituted or unsubstituted.

In an implementation, A of Chemical Formula 1 may be or may include, e.g., a moiety of Group 1. For example, A of Chemical Formula 1 may be a divalent linking group of a moiety of Group 1.

[Group 1]

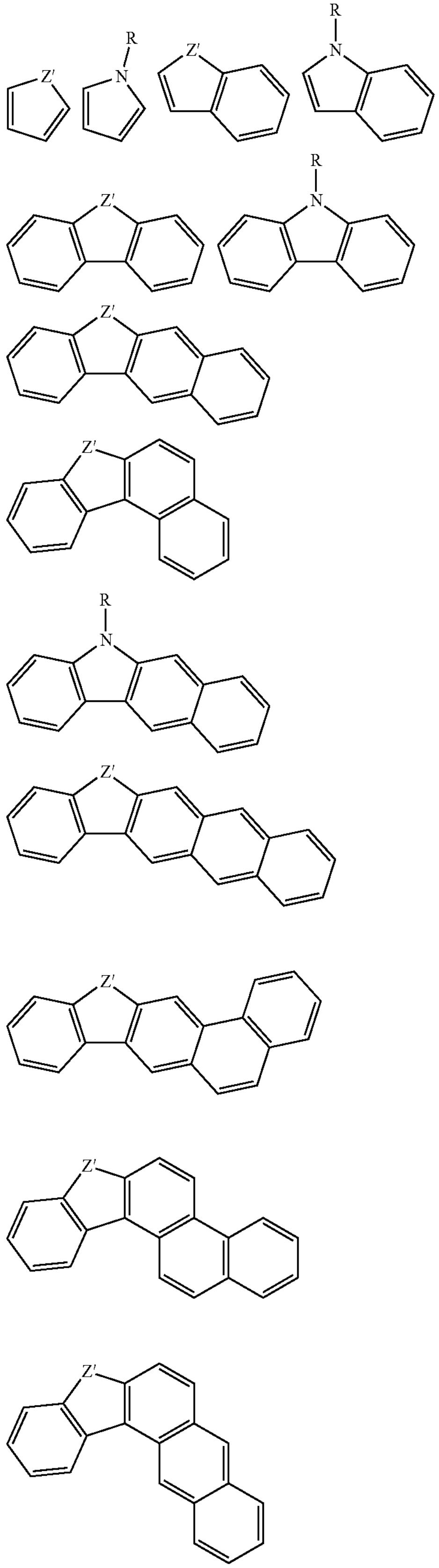

-continued

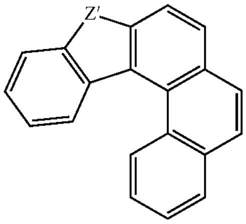

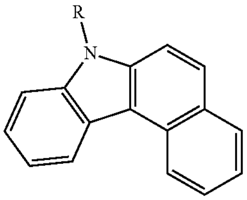

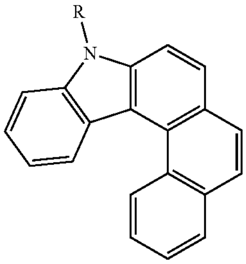

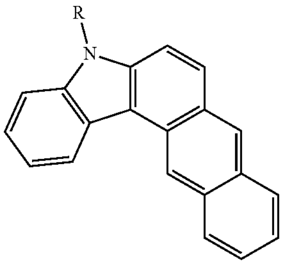

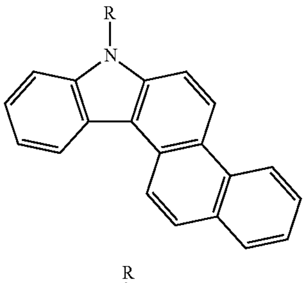

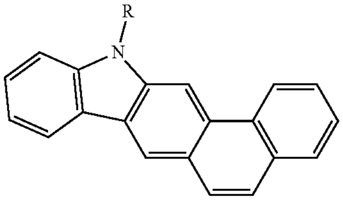

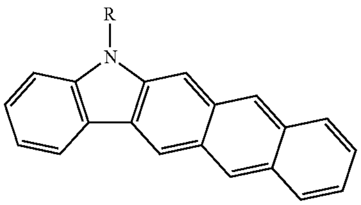

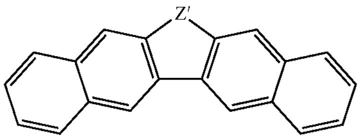

-continued

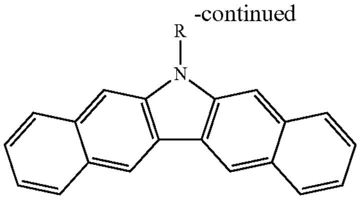

In Group 1, Z' may be, e.g., O or S, and R may be defined the same as that of Chemical Formula 3 or Chemical Formula 3-1.

In an implementation, A in Chemical Formula 1 may be or may include, e.g., a moiety of Group 1-1.

[Group 1-1]

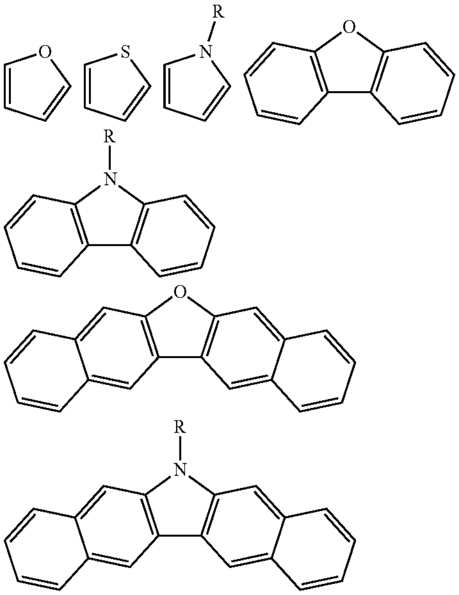

In Group 1-1, R may be, e.g., hydrogen, a substituted or unsubstituted C1 to C30 alkyl group, a substituted or unsubstituted C2 to C30 alkenyl group, a substituted or unsubstituted C2 to C30 alkynyl group, or a substituted or unsubstituted C6 to C30 aromatic hydrocarbon group.

In an implementation, each B of Chemical Formula 1 may independently be or include, e.g., a moiety of Group 2 substituted with one or more hydroxyl groups or C1 to C10 alkoxy groups. For example, each B of Chemical Formula 1 may be a divalent linking group of a moiety of Group 2.

[Group 2]

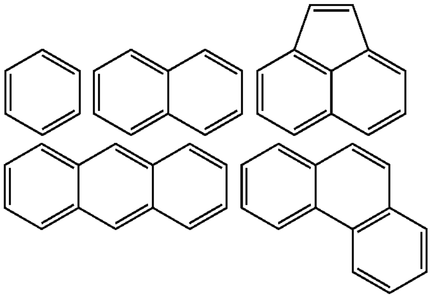

-continued

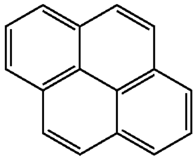

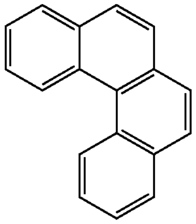

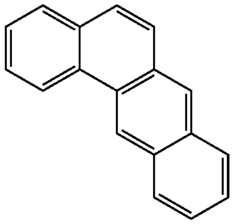

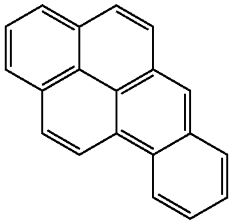

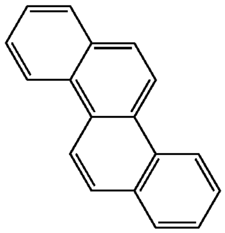

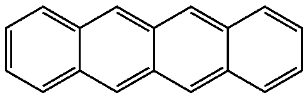

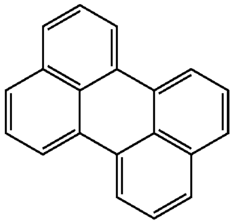

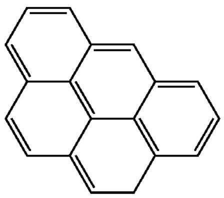

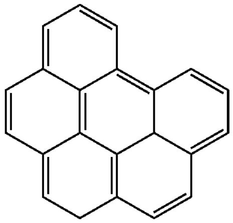

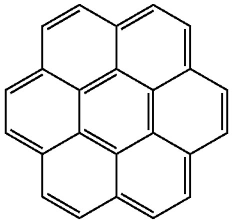

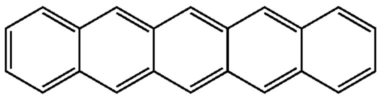

In an implementation, each B of Chemical Formula 1 may independently be a moiety of Group 2 substituted with one or more hydroxyl groups or C1 to C10 alkoxy groups. The C1 to C10 alkoxy groups may include, e.g., a methoxy group, an ethoxy group, a propoxy group, a butoxy group, a pentoxy group, a hexoxy group, a heptoxy group, or the like, e.g., a methoxy group, an ethoxy group, a propoxy group, or a butoxy group.

In an implementation, each B of Chemical Formula 1 may independently be or include, e.g., a moiety of Group 2-1.

[Group 2-1]

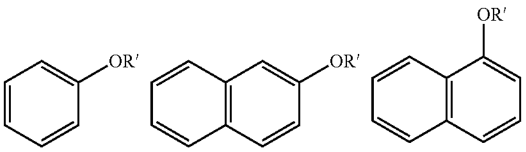

In Group 2-1, R' may be or may include, e.g., hydrogen, a substituted or unsubstituted C1 to C10 alkyl group, a substituted or unsubstituted C2 to C10 alkenyl group, or a substituted or unsubstituted C2 to C10 alkynyl group.

In an implementation, the structural unit represented by Chemical Formula 1 may be represented by, e.g., one of Chemical Formula 1-1 to Chemical Formula 1-10.

[Chemical Formula 1-1]

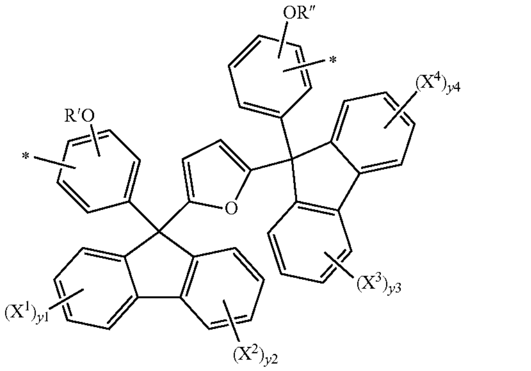

[Chemical Formula 1-2]

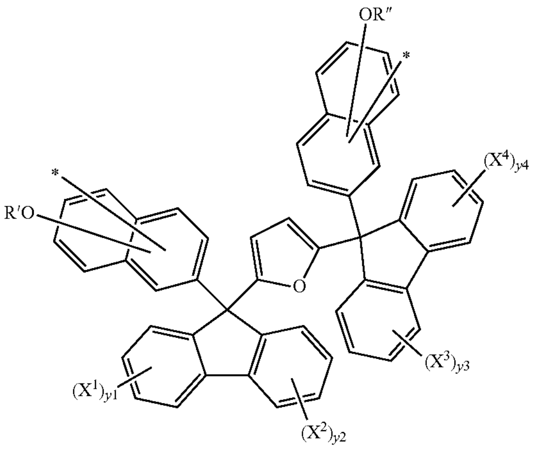

[Chemical Formula 1-3]

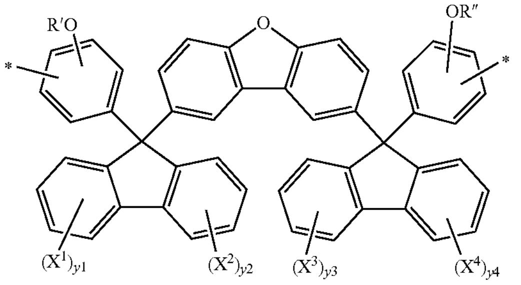

-continued

[Chemical Formula 1-4]

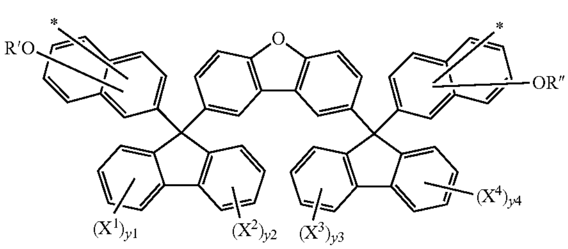

[Chemical Formula 1-5]

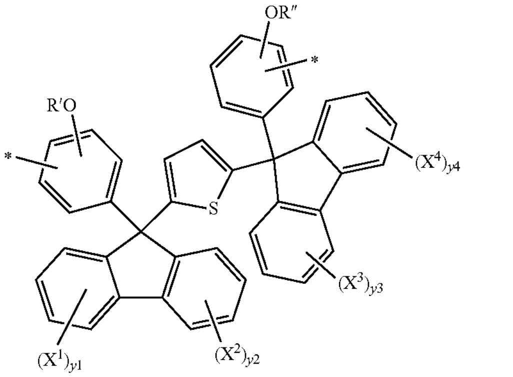

[Chemical Formula 1-6]

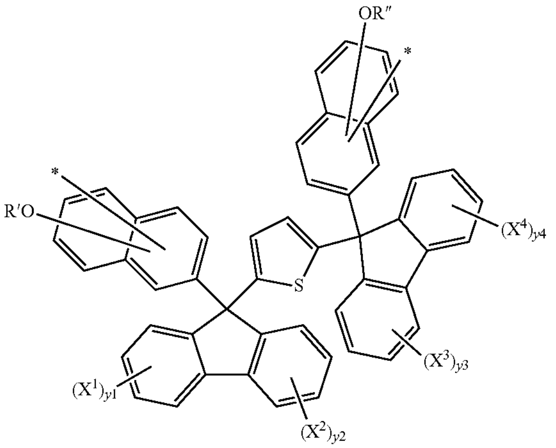

[Chemical Formula 1-7]

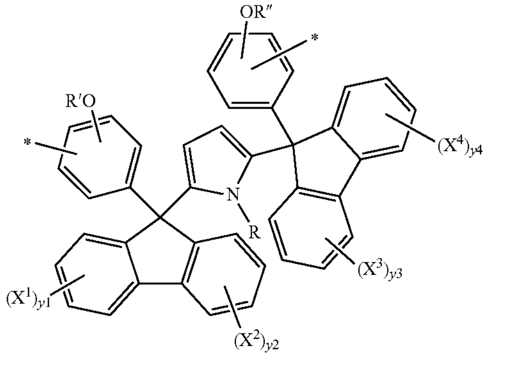

-continued

[Chemical Formula 1-8]

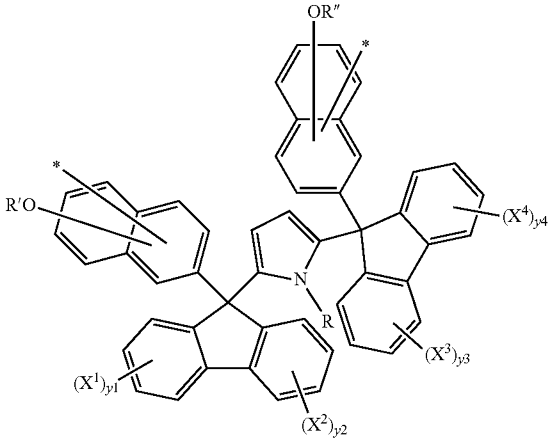

[Chemical Formula 1-9]

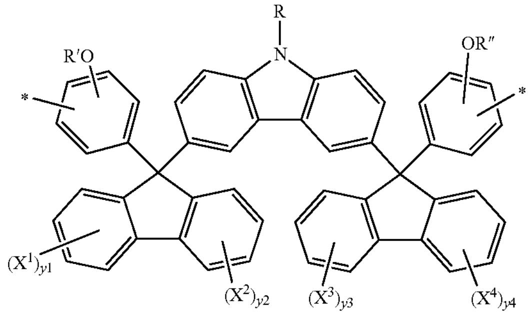

[Chemical Formula 1-10]

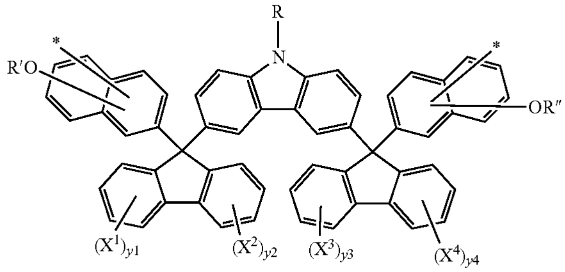

In Chemical Formula 1-1 to Chemical Formula 1-10, R may be, e.g., hydrogen, a substituted or unsubstituted monovalent C1 to C30 saturated aliphatic hydrocarbon group, a substituted or unsubstituted monovalent C2 to C30 unsaturated aliphatic hydrocarbon group, or a substituted or unsubstituted C6 to C30 aromatic hydrocarbon group, for example, a substituted or unsubstituted C1 to C30 alkyl group, a substituted or unsubstituted C2 to C30 alkenyl group, a substituted or unsubstituted C2 to C30 alkynyl group, or a substituted or unsubstituted C6 to C30 aromatic hydrocarbon group.

R' and R" may each independently be or include, e.g., hydrogen, a substituted or unsubstituted C1 to C10 alkyl group, a substituted or unsubstituted C2 to C10 alkenyl group, or a substituted or unsubstituted C2 to C10 alkynyl group.

$X^1$ to $X^4$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, y1 to y4 are each independently an integer of 0 to 4, and

* is a linking point.

In an implementation, $L^1$ and $L^2$ of Chemical Formula 2 may each independently be, e.g., a single bond or a substituted or unsubstituted C1 to C10 alkylene group. M may be, e.g., —O—. $Z^1$ and $Z^2$ may each independently be, e.g., deuterium, a hydroxy group, a halogen atom, a substituted or unsubstituted C1 to C30 alkoxy group, or a substituted or unsubstituted C1 to C30 saturated aliphatic hydrocarbon group. k and 1 may each independently be, e.g., an integer of 0 to 2. p and q may each independently be, e.g., 0 or 1.

In an implementation, the structural unit represented by Chemical Formula 2 may be represented by, e.g., Chemical Formula 2-1 or Chemical Formula 2-2.

[Chemical Formula 2-1]

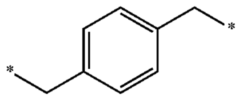

[Chemical Formula 2-2]

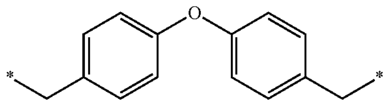

The polymer may have a molecular weight of, e.g., about 1,000 g/mol to about 200,000 g/mol. In an implementation, the polymer may have a molecular weight of about 1,000 g/mol to about 150,000 g/mol, e.g., about 1,000 g/mol to about 100,000 g/mol, about 1,200 g/mol to about 50,000 g/mol, or about 1,200 g/mol to about 10,000 g/mol. When the polymer has a molecular weight within the above ranges, a carbon content and solubility in a solvent of the hardmask composition including the polymer may be adjusted and optimized.

The polymer may be included in an amount of, e.g., about 0.1 wt % to about 50 wt % based on the total weight of the hardmask composition. In an implementation, the polymer may be included in an amount of about 0.1 wt % to about 50 wt %, e.g., about 0.2 wt % to about 50 wt %, about 0.5 wt % to about 30 wt %, about 1 wt % to about 30 wt %, about 1.5 wt % to about 25 wt %, or about 2 wt % to about 20 wt %. By including the compound within the above ranges, a thickness, a surface roughness, and a planarization degree of the hardmask may be easily adjusted.

The hardmask composition according to an embodiment may include a solvent. In an implementation, the solvent may include, e.g., propylene glycol, propylene glycol diacetate, methoxy propanediol, diethylene glycol, diethylene glycol butyl ether, tri(ethylene glycol) monomethyl ether, propylene glycol monomethyl ether, propylene glycol monomethyl ether acetate, cyclohexanone, ethyl lactate, gamma-butyrolactone, N,N-dimethylformamide, N,N-dimethylacetamide, methylpyrrolidone, methylpyrrolidinone, acetylacetone, ethyl 3-ethoxypropionate, or the like. In an implementation, the solvent may be a suitable solvent that has sufficient solubility and/or dispersibility for the polymer.

In an implementation, the hardmask composition may further include additives, e.g., a surfactant, a crosslinking agent, a thermal acid generator, or a plasticizer.

The surfactant may include, e.g., a fluoroalkyl-based compound, an alkylbenzenesulfonate, an alkylpyridinium salt, polyethylene glycol, a quaternary ammonium salt, or the like.

The crosslinking agent may include, e.g., a melamine crosslinking agent, a substituted urea crosslinking agent, or a polymer crosslinking agent. In an implementation, it may be a crosslinking agent having at least two crosslinking substituents, e.g., methoxymethylated glycoruryl, butoxymethylated glycoruryl, methoxymethylated melamine, butoxymethylated melamine, methoxymethylated benzoguanamine, butoxy methylated benzoguanamine, methoxymethylated urea, butoxymethylated urea, methoxymethylated thiourea, or butoxymethylated thiourea.

In an implementation, as the crosslinking agent, a crosslinking agent having high heat resistance may be used. The crosslinking agent having high heat resistance may include a compound containing a crosslinking substituent having an aromatic ring (e.g., a benzene ring or a naphthalene ring) in the molecule.

The thermal acid generator may include, e.g., an acid compound, such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, naphthalenecarboxylic acid, or 2,4,4,6-tetrabromocyclohexadienone, benzointosylate, 2-nitrobenzyltosylate, or other organic sulfonic acid alkyl esters.

In an implementation, a hardmask layer including a cured product of the aforementioned hardmask composition may be provided.

Hereinafter, a method of forming patterns using the aforementioned hardmask composition is described.

A method of forming patterns according to an embodiment may include providing a material layer on a substrate, applying a hardmask composition including the aforementioned polymer and solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a part of the material layer, and etching the exposed part of the material layer. The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer or a silicon nitride layer. The material layer may be formed through a method such as a chemical vapor deposition (CVD) process.

The hardmask composition may be the same as described above, and may be applied by spin-on coating in a form of a solution. In an implementation, a thickness of the hardmask film composition may be a suitable thickness, e.g., about 50 Å to about 200,000 Å.

The heat-treating of the hardmask composition may be performed, e.g., at about 100° C. to about 600° C. for about 10 seconds to about 1 hour. In an implementation, the heat-treating of the hardmask composition may include a plurality of heat-treating processes, e.g., a first heat-treating process, and a second heat-treating process.

In an implementation, the heat-treating of the hardmask composition may include, e.g., one heat-treating process performed at about 100° C. to about 600° C. for about 10 seconds to about 1 hour, and e.g., the heat-treating may be performed under an atmosphere of air or nitrogen, or an atmosphere having oxygen concentration of 1 wt % or less.

In an implementation, the heat-treating of the hardmask composition may include, e.g., a first heat-treating process performed at about 100° C. to about 1,000° C., for example about 100° C. to about 600° C. for about 10 seconds to about 1 hour, and e.g., a second heat-treating process performed at about 100° C. to about 1,000° C., e.g., about 300° C. to 1,000° C., about 500° C. to 1,000° C., or about 500° C. to 800° C. for about 10 seconds to about 1 hour consecutively. In an implementation, the first and second heat-treating processes may be performed under an atmosphere of air or nitrogen, or an atmosphere having oxygen concentration of 1 wt % or less.

By performing at least one of the steps of heat-treating the hardmask composition at a high temperature of 200° C. or higher, high etch resistance capable of withstanding etching gas and chemical liquid exposed in subsequent processes including the etching process may be exhibited.

In an implementation, the forming of the hardmask layer may include a UV/Vis curing process and/or a near IR curing process.

In an implementation, the forming of the hardmask layer may include a first heat-treating process, a second heat-treating process, a UV/Vis curing process, or a near IR curing process, or may include two or more processes consecutively.

In an implementation, the method may further include forming a silicon-containing thin layer on the hardmask layer. The silicon-containing thin layer may be formed of a material, e.g., SiCN, SiOC, SiON, SiOCN, SiC, SiO, SiN, or the like.

In an implementation, the method may further include forming a bottom antireflective coating (BARC) on the silicon-containing thin layer or on the hardmask layer before forming the photoresist layer.

In an implementation, exposure of the photoresist layer may be performed using, e.g., ArF, KrF, or EUV. After exposure, heat-treating may be performed at about 100° C. to about 700° C.

In an implementation, the etching process of the exposed part of the material layer may be performed through a dry etching process using an etching gas and the etching gas may include, e.g., $N_2/O_2$, $CHF_3$, $CF_4$, $Cl_2$, $BCl_3$, or a mixed gas thereof.

The etched material layer may be formed in a plurality of patterns, and the plurality of patterns may include a metal pattern, a semiconductor pattern, an insulation pattern, or the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Examples 1 to 3

Synthesis of Monomer

Synthesis Example 1

As shown in Reaction Scheme 1, 2 molar equivalents of 9-(6-hydroxy-2-naphthyl)fluoren-9-ol and 1 molar equivalent of thiophene were mixed, preparing Monomer 1 represented by Chemical Formula X1.

[Rection Scheme 1]

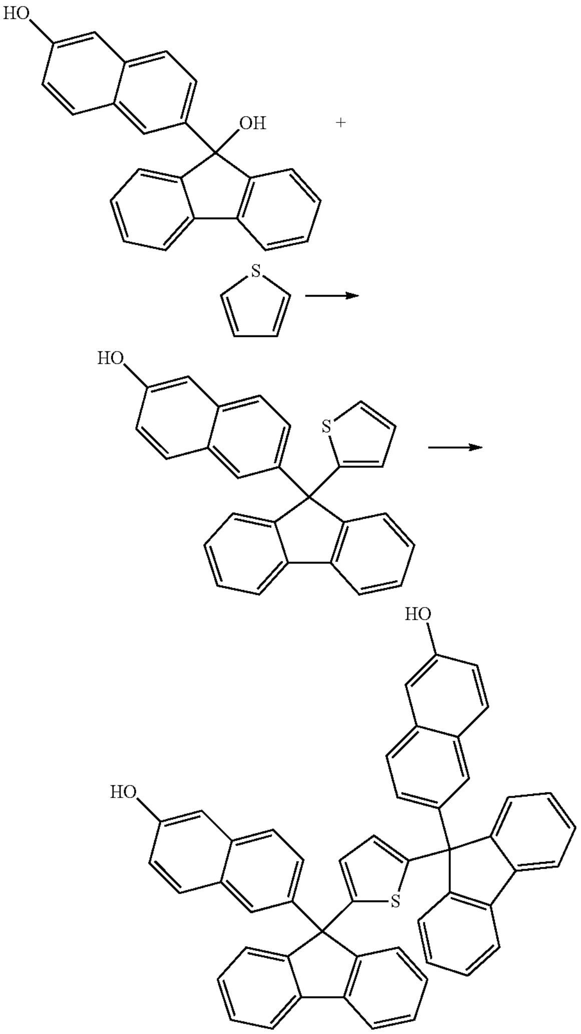

[Chemical Formula X1]

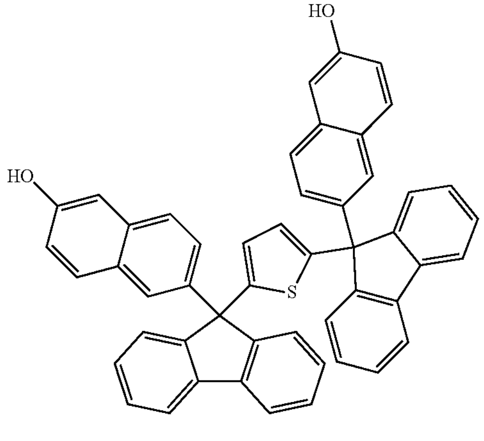

Synthesis Example 2

2 molar equivalents of 9-hydroxyphenyl-9-fluorenol and 1 molar equivalent of furan were mixed, preparing Monomer 2 represented by Chemical Formula X2.

[Chemical Formula X2]

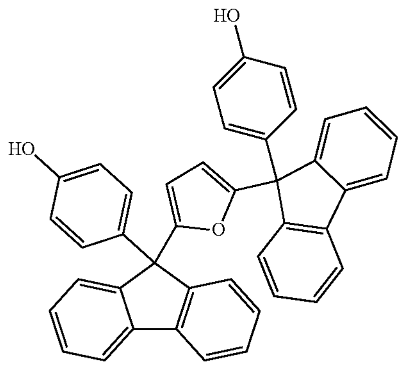

Synthesis Example 3

2 molar equivalents of 9-hydroxyphenyl-9-fluorenol and 1 molar equivalent of dibenzofuran were mixed, preparing Monomer 3 represented by Chemical Formula X3.

[Chemical Formula X3]

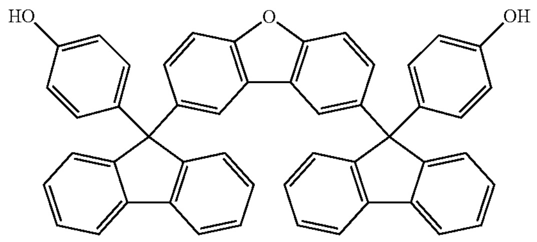

Synthesis Examples 4 to 9

Synthesis of Polymer

Synthesis Example 4

1 mole of the monomer represented by Chemical Formula X1 according to Synthesis Example 1, 1 mole of 1,4-bis(methoxymethyl)benzene, and 250 g of propylene glycol monomethylether acetate (PGMEA) as a solvent were mixed, preparing a solution. 15 mmol of diethyl sulfate was added to the solution and then, stirred at 100° C. for 24 hours. When a polymerization was completed, the resultant was precipitated in methanol to remove monomers and low molecular weight substances, obtaining a polymer including a structural unit represented by Chemical Formula 1-6a. (Mw: 4,980 g/mol)

[Chemical Formula 1-6a]

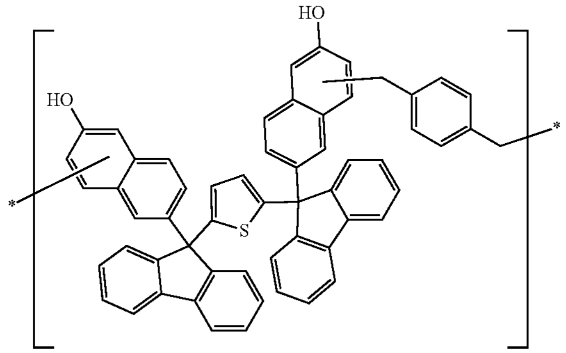

Synthesis Example 5

1 mole of the monomer represented by Chemical Formula X1 according to Synthesis Example 1, 1 mole of 4,4'-bismethoxymethyl diphenylether, and 250 g of propylene glycol monomethylether acetate (PGMEA) as a solvent were mixed, preparing a solution. 7 mmol of diethyl sulfate was added to the solution and then, stirred at 100° C. for 24 hours. When a polymerization was completed, the resultant was precipitated in methanol to remove monomers and low molecular weight substances, obtaining a polymer including a structural unit represented by Chemical Formula 1-6b. (Mw: 10,570 g/mol)

[Chemical Formula 1-6b]

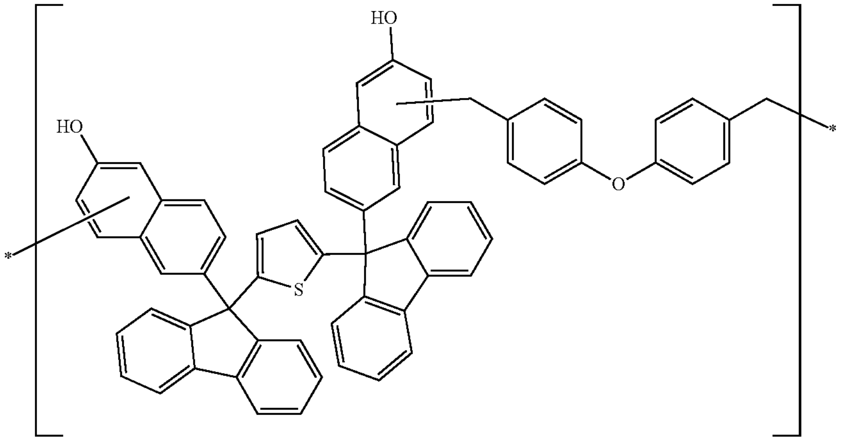

Synthesis Example 6

A polymer including a structural unit represented by Chemical Formula 1-1a was obtained in the same manner as in Synthesis Example 4 except that the monomer represented by Chemical Formula X2 according to Synthesis Example 2 was used instead of the monomer according to Synthesis Example 1. (Mw: 2,450 g/mol)

[Chemical Formula 1-1a]

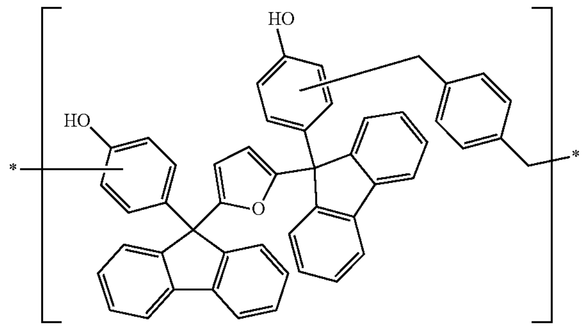

Synthesis Example 7

A polymer including a structural unit represented by Chemical Formula 1-1b was obtained in the same manner as in Synthesis Example 5 except that the monomer represented by Chemical Formula X2 according to Synthesis Example 2 was used instead of the monomer according to Synthesis Example 1. (Mw: 2,550 g/mol)

[Chemical Formula 1-1b]

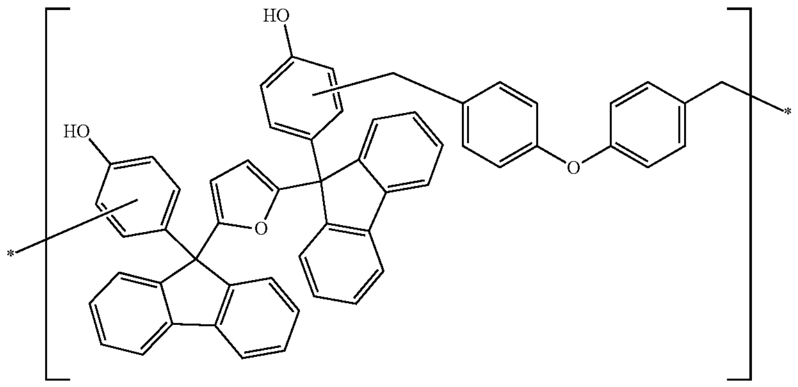

Synthesis Example 8

A polymer including a structural unit represented by Chemical Formula 1-3a was obtained in the same manner as in Synthesis Example 4 except that the monomer represented by Chemical Formula X3 according to Synthesis Example 3 was used instead of the monomer according to Synthesis Example 1. (Mw: 6,370 g/mol)

[Chemical Formula 1-3a]

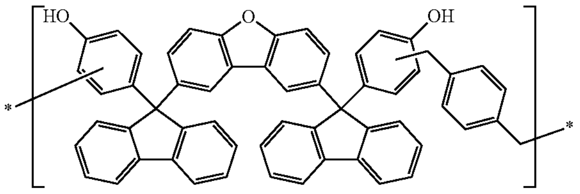

Synthesis Example 9

A polymer including a structural unit represented by Chemical Formula 1-3b was obtained in the same manner as in Synthesis Example 5 except that the monomer represented by Chemical Formula X3 according to Synthesis Example 3 was used instead of the monomer according to Synthesis Example 1. (Mw: 5,540 g/mol)

[Chemical Formula 1-3b]

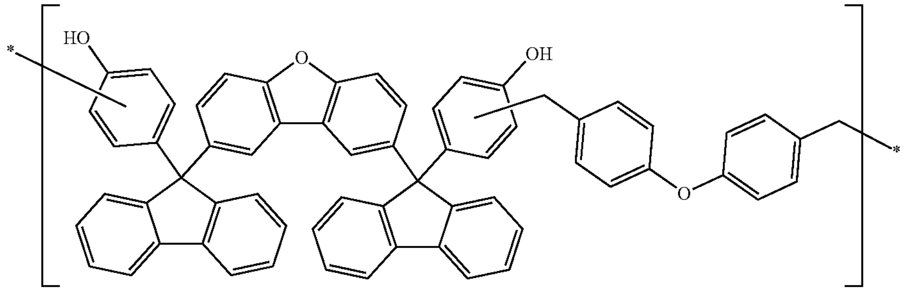

Comparative Synthesis Example 1

2 molar equivalents of fluorenone and 1 molar equivalent of 4,4'-dibromobiphenyl were mixed to prepare 9-[4-[4-(9-Hydroxy-1,2-dihydrofluoren-9-yl)phenyl]phenyl]fluoren-9-ol, and 2 molar equivalents of phenol was added thereto and then, reacted therewith, obtaining Monomer 4 represented by Chemical Formula X4.

[Chemical Formula X4]

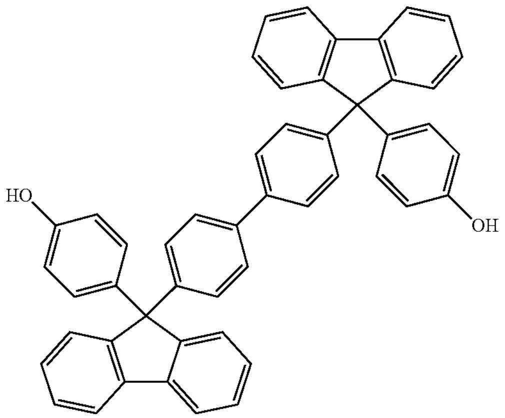

Comparative Synthesis Example 2

1 mole of the monomer represented by Chemical Formula X4 according to Comparative Synthesis Example 1, 1 mole of paraformaldehyde, and 250 g of propylene glycol monomethylether acetate (PGMEA) as a solvent were mixed, preparing a solution. 7 mmol of diethyl sulfate was added to the solution and then, stirred at 100° C. for 24 hours. When a polymerization was completed, the resultant was precipitated in methanol to remove monomers and low molecular weight substances, obtaining a polymer including a structural unit represented by Chemical Formula a. (Mw: 13,200 g/mol)

[Chemical Formula a]

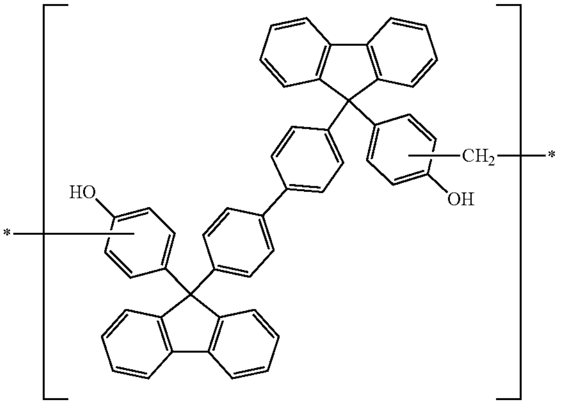

Comparative Synthesis Example 3

1 mole of the monomer represented by Chemical Formula X4 according to Comparative Synthesis Example 1, 1 mole of 1,4-bis(methoxymethyl)benzene, and 250 g of propylene glycol monomethylether acetate (PGMEA) as a solvent were mixed, preparing a solution. 15 mmol of diethyl sulfate was added to the solution and then, stirred at 100° C. for 24 hours. When a polymerization was completed, the resultant was precipitated in methanol to remove monomers and low molecular weight substances, obtaining a polymer including a structural unit represented by Chemical Formula b. (Mw: 2,800 g/mol)

[Chemical Formula b]

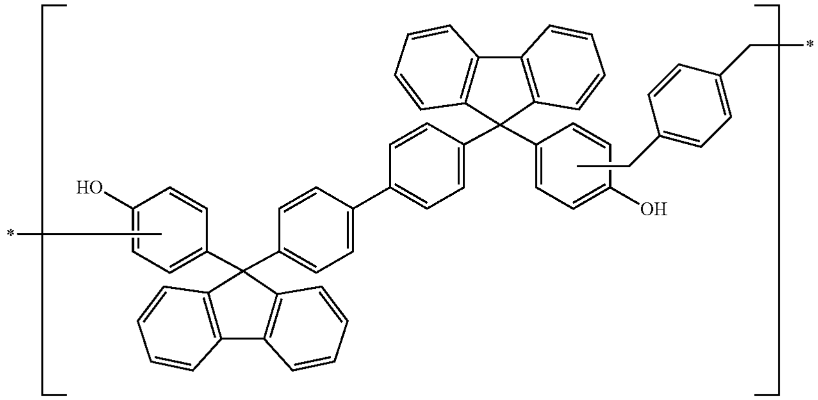

Comparative Synthesis Example 4

50.0 g (0.143 mol) of 9,9'-bis(4-hydroxyphenyl)fluorene, 23.7 g (0.143 mol) of 1,4-bis(methoxymethyl)benzene, and 50 g of propylene glycol monomethylether acetate were put in a flask, preparing a solution. 1.10 g (7.13 mmol) of diethyl sulfate was added thereto and then, stirred at 100° C. for 24 hours. When a polymerization was completed, the resultant was precipitated in methanol to remove monomers and low molecular weight substances, obtaining a polymer including a structural unit represented by Chemical Formula c. (Mw: 33,500 g/mol)

[Chemical Formula c]

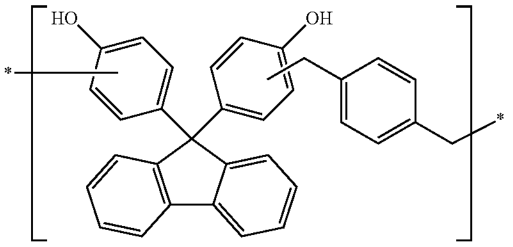

Examples and Comparative Examples

Preparation of Hardmask Composition

Example 1

3.5 g of the compound according to Synthesis Example 4 was dissolved in 10 g of propylene glycol monomethylether acetate (PGMEA) and then, filtered with a 0.1 μm TEFLON (tetrafluoroethylene) filter, preparing a hardmask composition.

Example 2

A hardmask composition was prepared in the same manner as in Example 1 except that the compound according to Synthesis Example 5 was used instead of the compound according to Synthesis Example 4.

Example 3

A hardmask composition was prepared in the same manner as in Example 1 except that the compound according to Synthesis Example 6 was used instead of the compound according to Synthesis Example 4.

Example 4

A hardmask composition was prepared in the same manner as in Example 1 except that the compound according to Synthesis Example 7 was used instead of the compound according to Synthesis Example 4.

Example 5

A hardmask composition was prepared in the same manner as in Example 1 except that the compound according to Synthesis Example 8 was used instead of the compound according to Synthesis Example 4.

Example 6

A hardmask composition was prepared in the same manner as in Example 1 except that the compound according to Synthesis Example 9 was used instead of the compound according to Synthesis Example 4.

Comparative Example 1

A hardmask composition was prepared in the same manner as in Example 1 except that the compound according to Comparative Synthesis Example 2 was used instead of the compound according to Synthesis Example 4.

Comparative Example 2

A hardmask composition was prepared in the same manner as in Example 1 except that the compound according to Comparative Synthesis Example 3 was used instead of the compound according to Synthesis Example 4.

Comparative Example 3

A hardmask composition was prepared in the same manner as in Example 1 except that the compound according to Comparative Synthesis Example 4 was used instead of the compound according to Synthesis Example 4.

Evaluation 1: Evaluation of Gap-Fill Characteristics and Planarization Characteristics The FIGURE is a reference view exemplarily showing a step difference of a hardmask layer in order to explain a method for evaluating planarization characteristics. The hardmask compositions according to Examples 1 to 6 and Comparative Examples 1 to 3 were respectively coated on a silicon pattern wafer by adjusting a mass ratio of solute to solvent to be 3:97 and then, baked, forming 1,100 Å-thick organic films. Gap-fill characteristics were evaluated by examining pattern cross-sections of the organic films with a scanning electron microscope (SEM) to judge whether voids were present. Planarization characteristics (step difference measurement) were evaluated by measuring each thickness of a peri region and a cell region on the scanning electron microscope (SEM) images of the organic films. The step difference was calculated by h0-h4. The results are shown in Table 1.

TABLE 1

| | Gap-fill characteristics (voids present) | Planarization characteristics (step difference, Å) |
|---|---|---|
| Example 1 | No | 203 |
| Example 2 | No | 78 |
| Example 3 | No | 116 |
| Example 5 | No | 121 |
| Example 6 | No | 44 |
| Comparative Example 1 | Yes | Unmeasurable |
| Comparative Example 2 | No | 175 |
| Comparative Example 3 | No | 157 |

Referring to Table 1, the organic films formed of the hardmask compositions according to Examples 1 to 3, 5, and 6 exhibited excellent planarization characteristics and gap-fill characteristics, compared with the organic film formed of the hardmask composition according to Comparative Example 1.

Evaluation 2: Evaluation of Etch Resistance 15 wt % of each hardmask composition according to Examples 1 to 6 and Comparative Examples 1 to 3 was coated on a silicon wafer in a spin-on coating method and then, heat-treated on a hot plate at 400° C. for 2 minutes, forming 4,000 Å-thick thin films. The thin films were measured with respect to a thickness by using a thin film thickness meter made by K-MAC. Subsequently, the thin films were dry-etched by using $CHF_3/CF_4$ mixed gas for 100 seconds and then, measured with respect to a thickness to calculate a thickness difference before and after the dry etching, which was used with etching according to Calculation Equation 1 to calculate a bulk etch rate (BER). The results are shown in Table 2.

$$\text{Etch rate } (\text{Å}/s) = (\text{initial thin film thickness} - \text{thin film thickness after etching})/\text{etch time (sec)} \quad \text{[Calculation Equation 1]}$$

TABLE 2

| | $CF_x$ Bulk etch rate (Å/s) |
|---|---|
| Example 1 | 26.4 |
| Example 2 | 27.8 |
| Example 3 | 24.1 |
| Example 4 | 28.5 |
| Example 5 | 26.7 |
| Example 6 | 24.4 |
| Comparative Example 1 | 30.7 |
| Comparative Example 2 | 30.4 |
| Comparative Example 3 | 29.0 |

Referring to Table 2, the thin films formed of the hardmask compositions according to Examples 1 to 6 exhibited a low etch rate, compared with the thin films formed of the hardmask compositions according to Comparative Examples 1 to 3. Accordingly, the hardmask compositions according to Examples 1 to 6 exhibited higher cross-linking degrees and thus higher etch resistance than the hardmask compositions according to Comparative Examples 1 to 3.

Evaluation 3: Evaluation of Solubility

The hardmask compositions according to Examples 1 to 6 and Comparative Examples 1 to 3 were respectively dissolved in propylene glycol monoethyl ether acetate (PGMEA) at a concentration of 10% to check whether the polymers were completely dissolved therein. The results are shown in Table 3.

In solubility evaluation of Table 3, "X" is given to a case of no remaining solids when examined with naked eyes, but "O" is given to a case of remaining solids when examined with the naked eyes.

TABLE 3

| | Precipitation |
|---|---|
| Example 1 | X |
| Example 2 | X |
| Example 3 | X |
| Example 4 | X |
| Example 5 | X |
| Example 6 | X |
| Comparative Example 1 | O |
| Comparative Example 2 | X |
| Comparative Example 3 | O |

Referring to Table 3, Examples 1 to 6 exhibited improved solubility, compared with Comparative Examples 1 to 3.

By way of summation and review, according to small-sizing the pattern to be formed, it could be difficult to provide a fine pattern having an excellent profile by only using some lithographic techniques. Accordingly, an auxiliary layer, called a hardmask layer, may be formed between the material layer and the photoresist layer to provide a fine pattern.

One or more embodiments may provide a hardmask composition that may be effectively applied to a hardmask layer.

The hardmask composition according to an embodiment may have excellent solubility in a solvent and thus can be effectively applied to the hardmask layer.

The hardmask layer formed from the hardmask composition according to the embodiment may secure excellent gap-fill characteristics, planarization characteristics, and etch resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:

a polymer including a structural unit represented by Chemical Formula 1 and a structural unit represented by Chemical Formula 2, and a solvent,

[Chemical Formula 1]

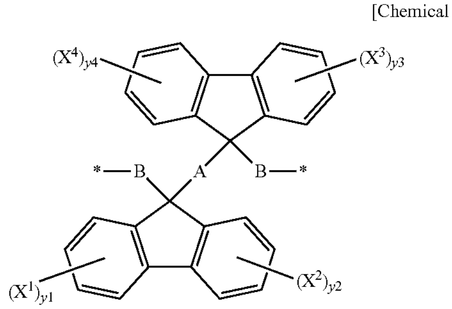

wherein, in Chemical Formula 1,

A is a linking group represented by Chemical Formula 3:

[Chemical Formula 3]

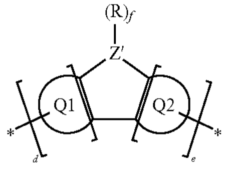

wherein, in Chemical Formula 3,

Z' is O or S,

Q1 and Q2 are each independently a substituted or unsubstituted C4 to C30 saturated or unsaturated alicyclic hydrocarbon group or a substituted or unsubstituted C6 to C30 aromatic hydrocarbon group, R is hydrogen, a substituted or unsubstituted monovalent C1 to C30 saturated aliphatic hydrocarbon group, a substituted or unsubstituted monovalent C2 to C30 unsaturated aliphatic hydrocarbon group, or a substituted or unsubstituted monovalent C6 to C30 aromatic hydrocarbon group, d and e are each independently an integer of 0 to 5, f is an integer of 0 to 2, and

* is a linking point,

B is a C6 to C30 aromatic hydrocarbon ring substituted with one or more hydroxy groups or C1 to C10 alkoxy groups, and

* is a linking point, $X^1$ to $X^4$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, y1 to y4 are each independently an integer of 0 to 4, and

* is a linking point,

[Chemical Formula 2]

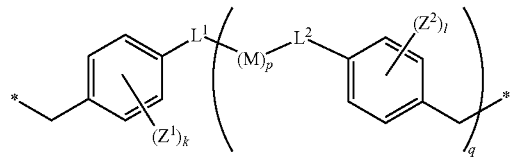

wherein, in Chemical Formula 2, $L^1$ and $L^2$ are each independently a single bond, a substituted or unsubstituted divalent C1 to C15 saturated aliphatic hydrocarbon group, or a substituted or unsubstituted divalent C2 to C15 unsaturated aliphatic hydrocarbon group, M is —O—, —S—, —$SO_2$—, or —C(=O)—, $Z^1$ and $Z^2$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, k, l, and q are each independently an integer of 0 to 4, p is 0 or 1, and

* is a linking point.

2. The hardmask composition as claimed in claim 1, wherein:

A in Chemical Formula 1 is a linking group represented by Chemical Formula 3-1:

[Chemical Formula 3-1]

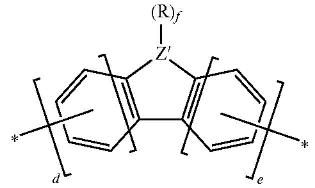

in Chemical Formula 3-1,

Z' is N, O, or S,

R is hydrogen, a substituted or unsubstituted monovalent C1 to C30 saturated aliphatic hydrocarbon group, a substituted or unsubstituted monovalent C2 to C30 unsaturated aliphatic hydrocarbon group, or a substituted or unsubstituted monovalent C6 to C30 aromatic hydrocarbon group, d and e are each independently an integer of 0 to 5, f is an integer of 0 to 2, and

* is a linking point.

3. The hardmask composition as claimed in claim 1, wherein:

A in Chemical Formula 1 includes a moiety of Group 1:

[Group 1]

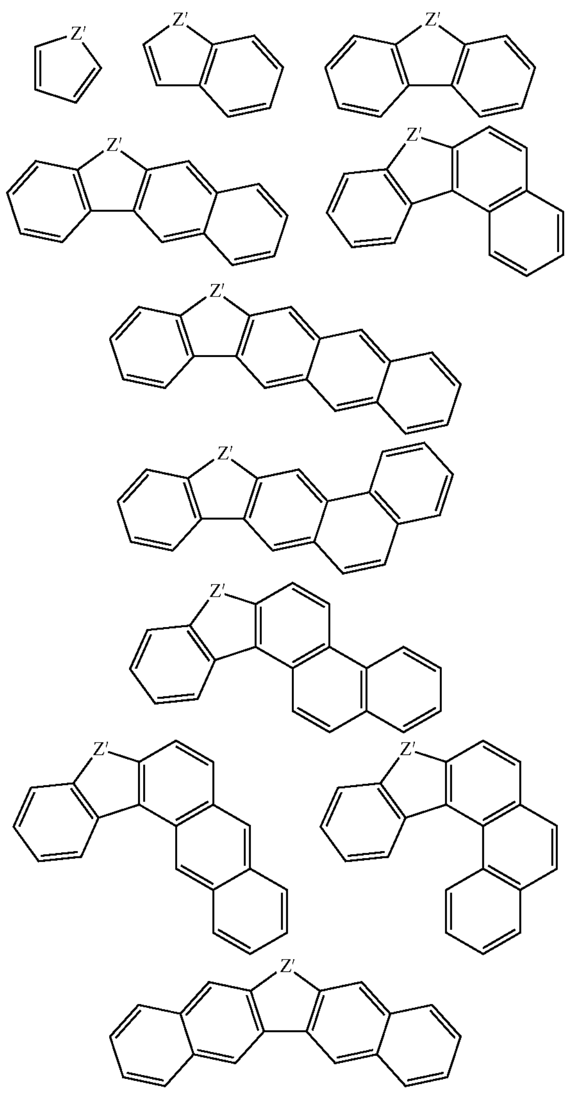

in Group 1,

Z' is O or S.

4. The hardmask composition as claimed in claim 1, wherein B of Chemical Formula 1 includes a moiety of Group 2 that is substituted with one or more hydroxyl groups or C1 to C10 alkoxy groups,

[Group 2]

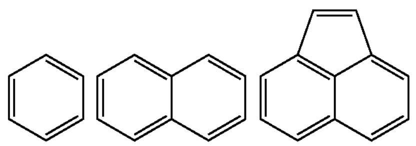

-continued

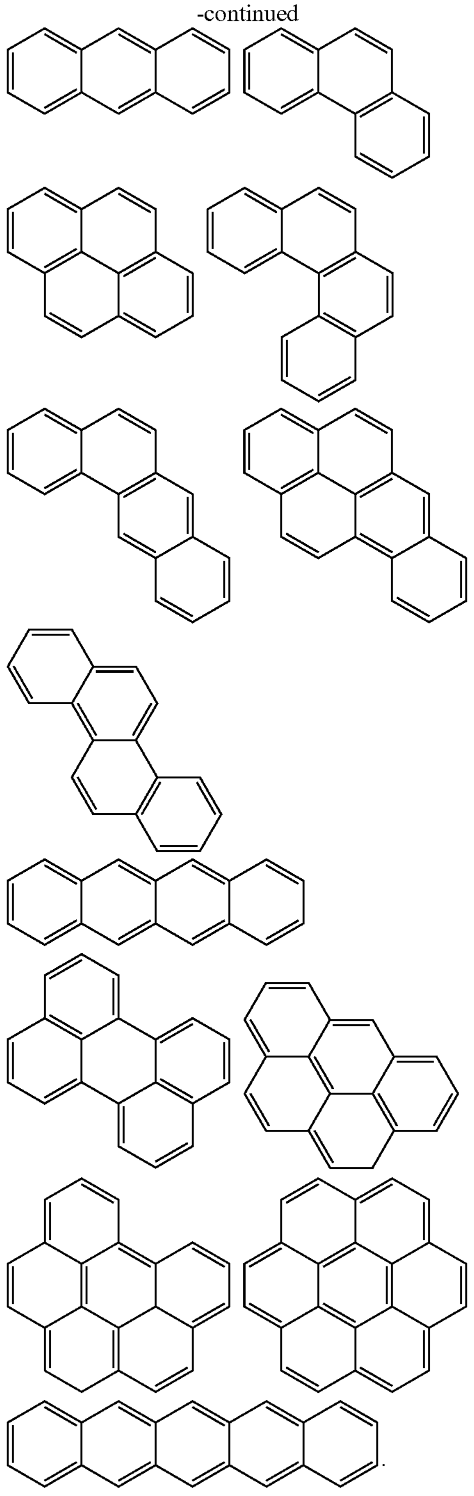

5. The hardmask composition as claimed in claim 1, wherein, in Chemical Formula 2, $L^1$ and $L^2$ are each independently a single bond or a substituted or unsubstituted C1 to C10 alkylene group, M is —O—, $Z^1$ and $Z^2$ are each independently deuterium, a hydroxy group, a halogen, a substituted or unsubstituted C1 to C30 alkoxy group, or a substituted or unsubstituted C1 to C30 saturated aliphatic hydrocarbon group, k and l are each independently an integer of 0 to 2, and p and q are each independently 0 or 1.

6. The hardmask composition as claimed in claim 1, wherein:

A in Chemical Formula 1 includes a moiety of Group 1-1:

[Group 1-1]

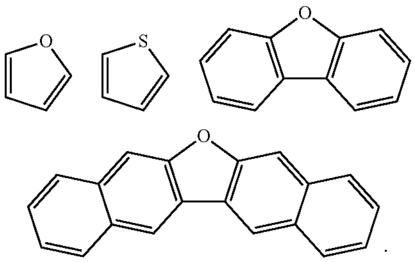

7. The hardmask composition as claimed in claim 1, wherein:

B in Chemical Formula 1 includes a moiety of Group 2-1:

[Group 2-1]

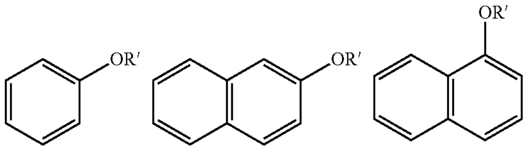

in Group 2-1, R' is hydrogen, a substituted or unsubstituted C1 to C10 alkyl group, a substituted or unsubstituted C2 to C10 alkenyl group, or a substituted or unsubstituted C2 to C10 alkynyl group.

8. The hardmask composition as claimed in claim 1, wherein:

the structural unit represented by Chemical Formula 1 is represented by one of Chemical Formula 1-1 to Chemical Formula 1-6,

[Chemical Formula 1-1]

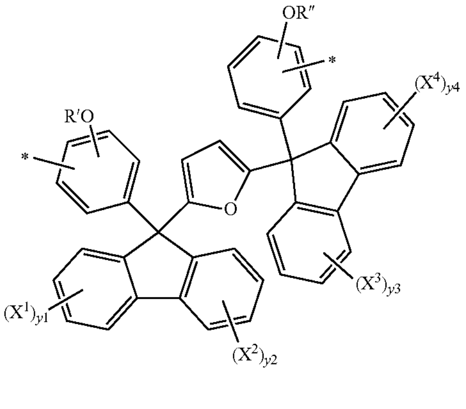

-continued

[Chemical Formula 1-2]

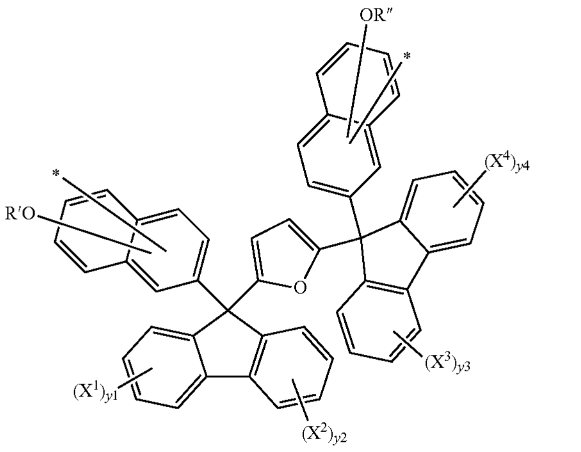

[Chemical Formula 1-3]

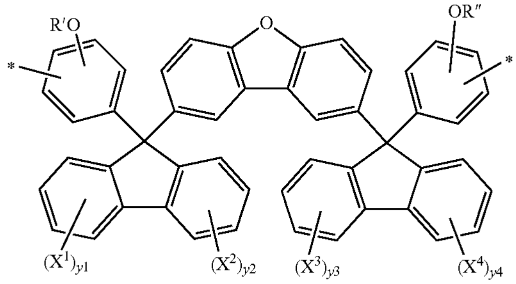

[Chemical Formula 1-4]

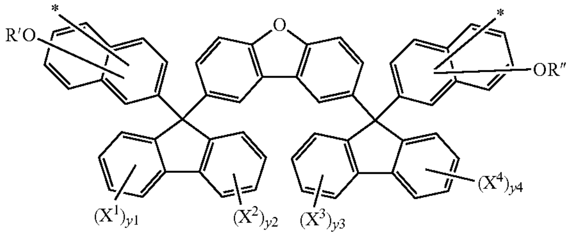

[Chemical Formula 1-5]

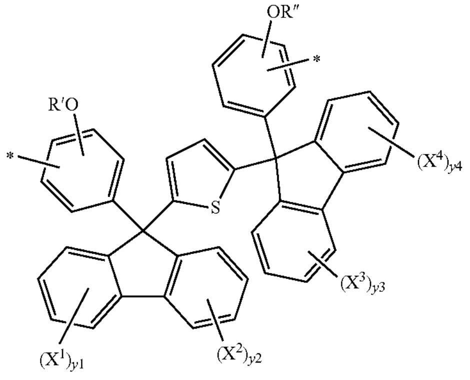

-continued

[Chemical Formula 1-6]

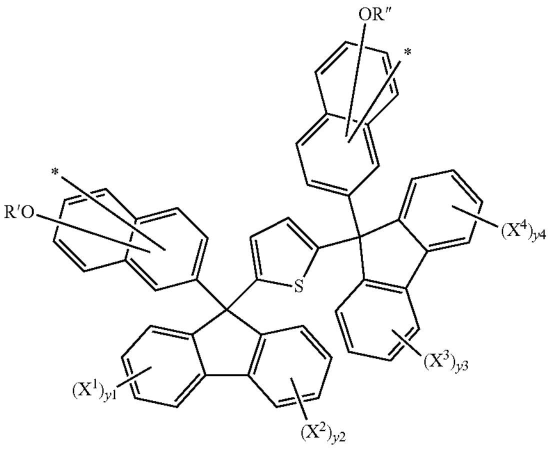

in Chemical Formula 1-1 to Chemical Formula 1-6,

R' and R" are each independently hydrogen, a substituted or unsubstituted C1 to C10 alkyl group, a substituted or unsubstituted C2 to C10 alkenyl group, or a substituted or unsubstituted C2 to C10 alkynyl group, $X^1$ to $X^4$ are each independently deuterium, a hydroxy group, a halogen, a substituted or unsubstituted C1 to C30 alkoxy group, a substituted or unsubstituted C1 to C30 saturated aliphatic hydrocarbon group, a substituted or unsubstituted C2 to C30 unsaturated aliphatic hydrocarbon group, a substituted or unsubstituted C6 to C30 aromatic hydrocarbon group, a substituted or unsubstituted C1 to C30 heteroalkyl group, or a substituted or unsubstituted C2 to C30 heteroaromatic hydrocarbon group, y1 to y4 are each independently an integer of 0 to 4, and

* is a linking point.

9. The hardmask composition as claimed in claim 1, wherein the structural unit represented by Chemical Formula 2 is represented by Chemical Formula 2-1 or Chemical Formula 2-2, in which * is a linking point,

[Chemical Formula 2-1]

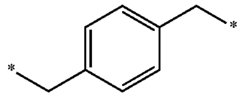

[Chemical Formula 2-2]

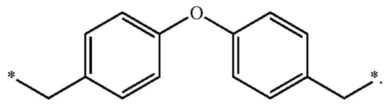

10. The hardmask composition as claimed in claim 1, wherein the polymer has a molecular weight of about 1,000 g/mol to about 200,000 g/mol.

11. The hardmask composition as claimed in claim 1, wherein the polymer is included in an amount of about 0.1 wt % to about 50 wt %, based on a total weight of the hardmask composition.

12. The hardmask composition as claimed in claim 1, wherein the solvent includes propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

13. The hardmask composition as claimed in claim 1, wherein the polymer including a structural unit represented by Chemical Formula 1 and a structural unit represented by Chemical Formula 2 includes one of the following structural units:

[Chemical Formula 1-6a]

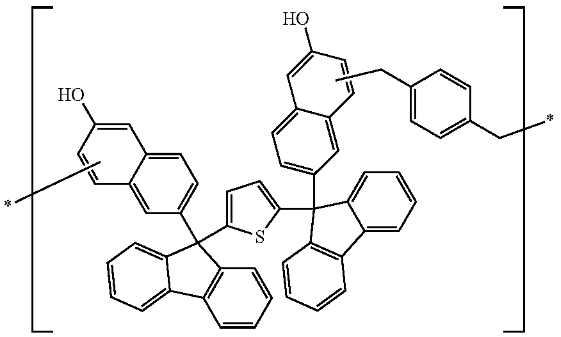

-continued
[Chemical Formula 1-6b]
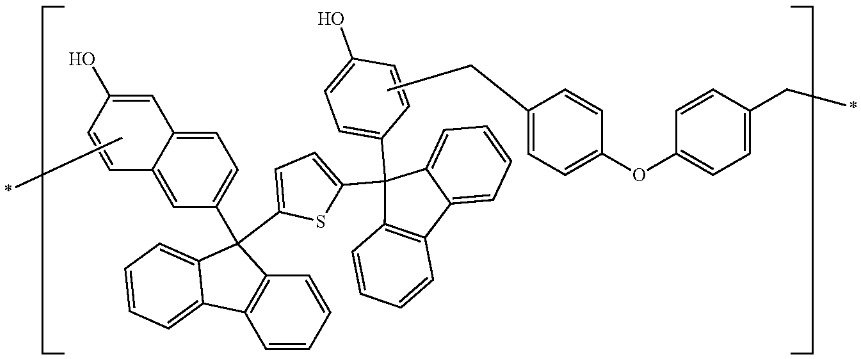
[Chemical Formula 1-1a]
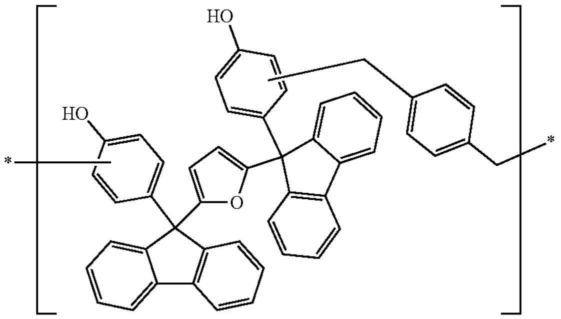
[Chemical Formula 1-1b]
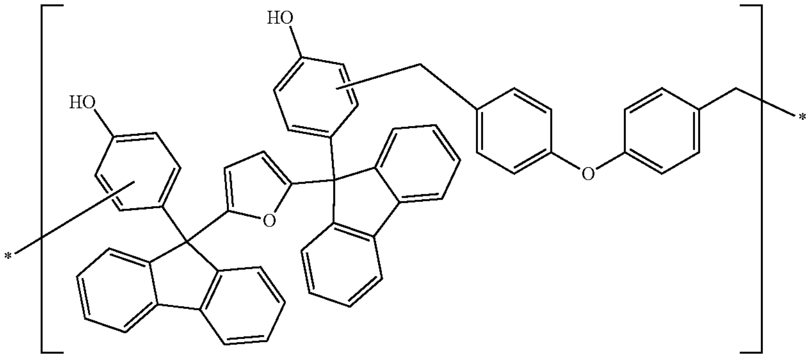
[Chemical Formula 1-3a]
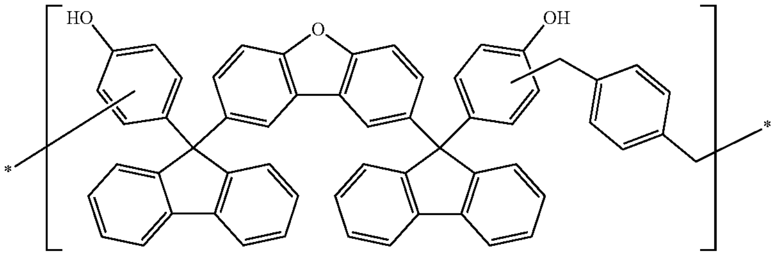
[Chemical Formula 1-3b]
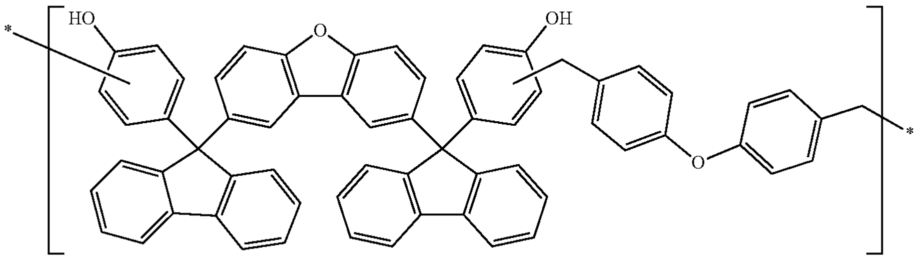

14. A hardmask layer comprising a cured product of the hardmask composition as claimed in claim 1.

15. A method of forming patterns, the method comprising:

providing a material layer on a substrate, applying the hardmask composition as claimed in claim 1 on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed part of the material layer.

16. The method as claimed in claim 15, wherein heat-treating the hardmask composition includes heat-treating at about 100° C. to about 600° C.

17. The hardmask composition as claimed in claim 2, wherein d and e of Chemical Formula 3-1 are each independently an integer of 1 to 5.

* * * * *